United States Patent
Kang

(10) Patent No.: US 7,663,441 B2
(45) Date of Patent: Feb. 16, 2010

(54) LOW NOISE AMPLIFIER

(75) Inventor: Byoung-Joong Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/033,044

(22) Filed: Feb. 19, 2008

(65) Prior Publication Data

US 2008/0204142 A1    Aug. 28, 2008

(30) Foreign Application Priority Data

Feb. 27, 2007    (KR) .................. 10-2007-0019515

(51) Int. Cl.
*H03G 3/10*    (2006.01)
(52) U.S. Cl. .................. 330/281; 330/149; 330/124 R
(58) Field of Classification Search ............... 330/281, 330/149, 124 R
See application file for complete search history.

(56) References Cited

U.S. PATENT DOCUMENTS

| | | | | |
|---|---|---|---|---|
| 5,635,874 A | * | 6/1997 | Perrot | .................. 330/259 |
| 5,995,819 A | * | 11/1999 | Yamaji et al. | .................. 455/326 |
| 6,828,858 B2 | * | 12/2004 | Larson et al. | .................. 330/277 |
| 7,332,961 B2 | * | 2/2008 | Blednov | .................. 330/149 |
| 7,425,872 B2 | * | 9/2008 | Inamori et al. | .................. 330/295 |

FOREIGN PATENT DOCUMENTS

| | | |
|---|---|---|
| KR | 1020050041556 A | 5/2005 |
| KR | 1020060070796 A | 6/2006 |
| KR | 100614928 B1 | 8/2006 |

\* cited by examiner

*Primary Examiner*—Patricia Nguyen
(74) *Attorney, Agent, or Firm*—Volentine & Whitt, P.L.L.C.

(57) ABSTRACT

A low noise amplifier includes a main amplifier configured to amplify a first input signal to generate a first output signal and an auxiliary amplifier configured to amplify a second input signal to generate a second output signal. The auxiliary amplifier is coupled to the main amplifier for superposing the second output signal and the first output signal. The low noise amplifier also includes an adjusting unit configured to adjust a time constant for reducing a third order intermodulation distortion of the superposed signal in response to a control signal. The adjusting unit is configured to generate the second input signal based on the time constant and the first input signal.

20 Claims, 7 Drawing Sheets

US 7,663,441 B2

LOW NOISE AMPLIFIER

CROSS-REFERENCE TO RELATED APPLICATIONS

A claim of priority is made to Korean Patent Application No. 10-2007-0019515, filed on Feb. 27, 2007, the subject matter of which is hereby incorporated by reference.

BACKGROUND OF THE INVENTION

1. Field of the Invention

Embodiments of the present invention relate to a low noise amplifier, and more particularly, to a low noise amplifier for reducing third order intermodulation distortion.

2. Description of the Related Art

A radio frequency integrated circuit (RFIC), manufactured using a complementary metal-oxide semiconductor (CMOS) process, is generally considered to be inappropriate for communications requiring high linearity, such as code division multiple access (CDMA) communications, due to its relatively poor performance compared to a bipolar junction transistor (BJT). Recently, though, developments enabling gate lengths of MOS transistors to be reduced have resulted in lower prices of CMOS RFICs. Additionally, various topologies may be applied to CMOS RFICs to improve their performance. Thus, the market share of CMOS RFICs is increasing.

FIG. 1A is a circuit diagram illustrating a conventional amplifier implemented using a MOS transistor.

Referring to FIG. 1A, an input signal is provided to a gate terminal of MOS transistor MN, biased with a resistor Rs coupled to a power supply voltage Vs. An output signal generated by amplifying the input signal is output through a drain terminal of the MOS transistor MN.

FIG. 1B is a diagram illustrating frequency components of the output signal of the amplifier of FIG. 1A.

Referring to FIG. 1B, the output signal of the amplifier, which is generated by the MOS transistor MN having non-linear characteristics, has fundamental frequency components F1 and F2 and intermodulation distortion components 2F1-F2 and 2F2-F1. Signals corresponding to combinations of harmonic components of input signals having different frequencies F1 and F2 may occur while the non-linear MOS transistor MN processes RF signals. Third order intermodulation components 2F1-F2 and 2F2-F1 may be located near the fundamental intermodulation components F1 and F2. Therefore, the third order intermodulation components 2F1-F2 and 2F2-F1 are difficult to eliminate completely by filtering.

A derivative superposition method may be applied to a CMOS RFIC in CDMA communications to enhance linearity. The derivative superposition method has been devised to enhance linearity of an amplifier implemented with a metal-semiconductor field effect transistor (MESFET) or a hetero-structure field effect transistor (HEMT).

FIG. 2 is a circuit diagram illustrating a conventional low noise amplifier adopting a derivative superposition method.

Referring to FIG. 2, unlike the amplifier using a single transistor depicted in FIG. 1A, the amplifier adopting the derivative superposition method includes two transistors MN1 and MN2. Two different bias voltages, based on voltages V1 and V2, may be provided to the two transistors MN1 and MN2. A drain terminal of the transistor MN2 may be coupled to a drain terminal of the transistor MN1. Therefore, an output signal of the transistor MN2 is superposed on an output signal of the transistor MN1. The superposed output signal may be output through the drain terminals of the transistors MN1 and MN2.

The output signal includes two intermodulation distortion contribution components having opposite characteristics. Thus, intermodulation distortion may be reduced by superposing the two opposite intermodulation distortion contribution components. The amplifier in FIG. 2, however, does not have a function for implementing noise matching.

FIG. 3A is another conventional low amplifier adopting a derivative superposition method.

Referring to FIG. 3A, the amplifier in FIG. 3A includes two transistors MN1 and MN2, as in the conventional low amplifier in FIG. 2. Two different bias voltages based on voltages V1 and V2 may be provided to the two transistors MN1 and MN2. A drain terminal of the transistor MN2 may be coupled to a drain terminal of the transistor MN1. Therefore, an output signal of the transistor MN2 is superposed on an output signal of the transistor MN1. The superposed output signal may be output through drain terminals of the transistors MN1 and MN2. A degeneration inductor L1 may be coupled to source terminals of the transistors MN1 and MN2 for simultaneously realizing low noise and linear characteristics. In the amplifier of FIG. 3A, however, a second order harmonic component generated by the degeneration inductor L1 may cause intermodulation distortion, even though third order harmonic components may be reduced.

FIG. 3B is a vector diagram illustrating the intermodulation components included in the output signal of the low noise amplifier of FIG. 3A.

Referring to FIG. 3B, the output signal of the low noise amplifier includes third order harmonic components 310 and 330, and second order harmonic component 320. It is therefore very difficult to control a vector sum of the various harmonic components to equal zero.

Additionally, conventional amplifiers implementing the derivative superposition method are difficult to manufacture. The manufacturing difficulty may be caused, for example, by variations in the MOS process and the inability to use integrated chips (IC) having undesirable performance.

SUMMARY OF THE INVENTION

Various embodiments of the present invention provide a low noise amplifier that reduces third order intermodulation distortion of an output signal, and associated methods.

In embodiments of the present invention, a low noise amplifier includes a main amplifier, an auxiliary amplifier and an adjusting unit. The main amplifier is configured to amplify a first input signal and to generate a first output signal. The auxiliary amplifier is configured to amplify a second input signal and to generate a second output signal, the auxiliary amplifier being coupled to the main amplifier for superposing the second output signal and the first output signal. The adjusting unit is configured to adjust a time constant for reducing a third order intermodulation distortion of the superposed signal in response to a control signal. The adjusting unit generates the second input signal based on the time constant and the first input signal.

The adjusting unit may include a capacitor unit and a resistor unit. The adjusting unit may be configured to adjust the time constant by adjusting at least one of a capacitance of the capacitor unit or a resistance of the resistor unit.

The control signal may be a digital signal having multiple bits. The capacitor unit may include multiple varactors, coupled in parallel, corresponding to the multiple bits. The adjusting unit may adjust the capacitance of the capacitor unit by adjusting a capacitance of each varactor in response to the corresponding bit of the digital signal.

The resistor unit may include multiple serially connected pairs of resistors and MOS transistors corresponding to the multiple bits of the control signal. Each resistor may be coupled between a drain terminal and a source terminal of each corresponding MOS transistor. The adjusting unit may adjust the resistance of the resistor unit by adjusting a resistance of each pair in response to the corresponding bit of the digital signal provided to a gate terminal of the respective MOS transistor. Also, the resistor unit may include multiple resistors coupled in parallel and multiple MOS switches coupled to the resistors, where a gate terminal of each of the MOS switches corresponds to a bit of the multiple bits in the digital control signal. The adjusting unit may adjust the resistance of the resistor unit in response to the bits provided to the corresponding gate terminals of the MOS switches.

The control signal may be an analog signal. The capacitor unit may include a varactor. The adjusting unit may adjust the time constant by adjusting a capacitance of the varactor in response to the analog signal.

The capacitor unit may be coupled between a first node for receiving the first input signal and a second node for outputting the second input signal. The resistor unit may be coupled between the second node and a third node for receiving a bias voltage of the auxiliary amplifier.

The low noise amplifier may further include an impedance matching unit coupled to the main amplifier and the auxiliary amplifier. The impedance matching unit may be configured to adjust an impedance for reducing the third order intermodulation distortion of the superposed signal.

The impedance matching unit may include a first inductor coupled between the auxiliary amplifier and a ground voltage, and a second inductor coupled between the main amplifier and the auxiliary amplifier. The first inductor may be a down bond wire, and the second inductor may be a spiral inductor.

The main amplifier may include a first NMOS transistor having a gate terminal for receiving the first input signal, a drain terminal for outputting the first output signal and a source terminal coupled to the impedance matching unit. The auxiliary amplifier may include a second NMOS transistor having a gate terminal for receiving the second input signal, a drain terminal for outputting the second output signal and a source terminal coupled to the impedance matching unit. Alternatively, the auxiliary amplifier may include a PMOS transistor having a gate terminal for receiving the second input signal, a source terminal for outputting the second output signal and a drain terminal coupled to the impedance matching unit.

The main amplifier may include a first MOS transistor operating in a strong inversion region. The auxiliary amplifier may include a second MOS transistor operating in a weak inversion region.

Accordingly, the low noise amplifier according to exemplary embodiments of the present invention may reduce the third order intermodulation distortion of the output signal.

DESCRIPTION OF THE EMBODIMENTS

Figure 1A:
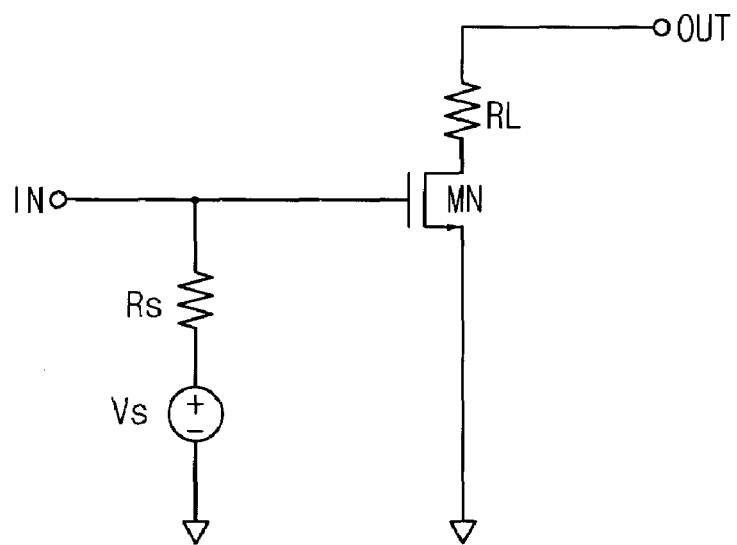
FIG. 1A is a circuit diagram illustrating a conventional amplifier implemented using a MOS transistor.
Figure 1B:
FIG. 1B is a diagram illustrating frequency components of an output signal of the amplifier of FIG. 1A.
Figure 2:
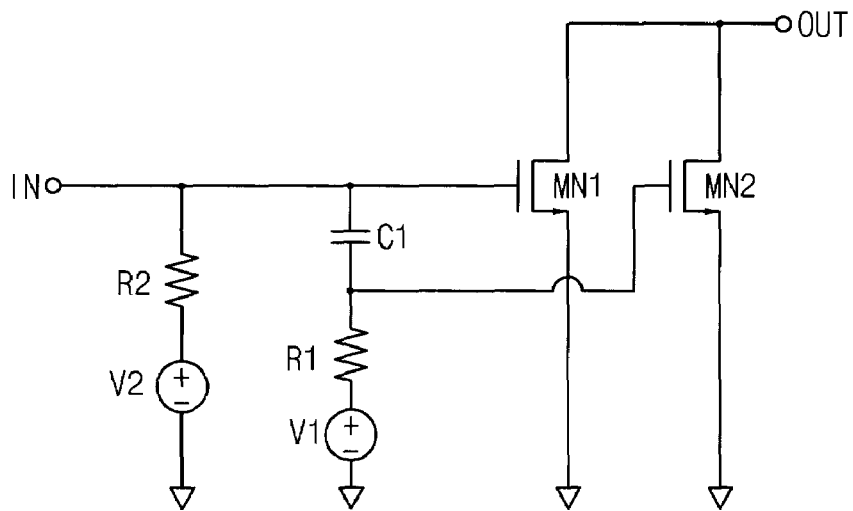
FIG. 2 is a circuit diagram illustrating a conventional low noise amplifier using derivative superposition.
Figure 3A:
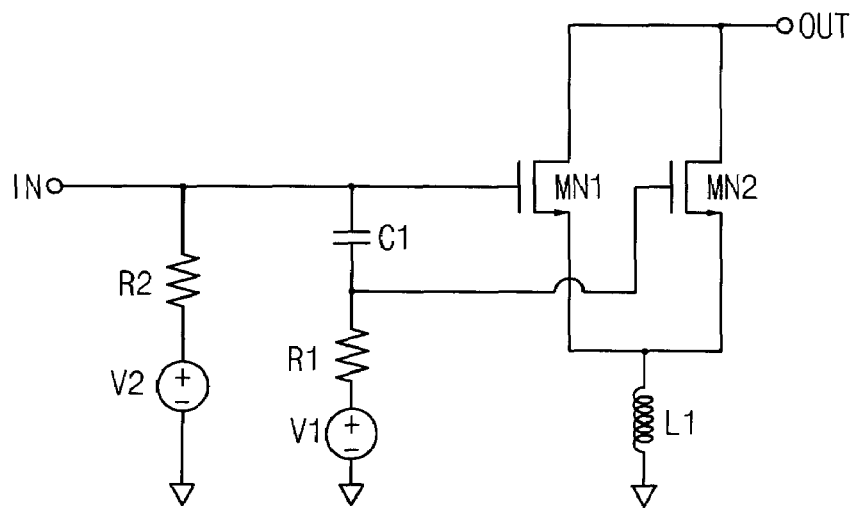
FIG. 3A is a circuit diagram illustrating another conventional low noise amplifier using derivative superposition.
Figure 3B:
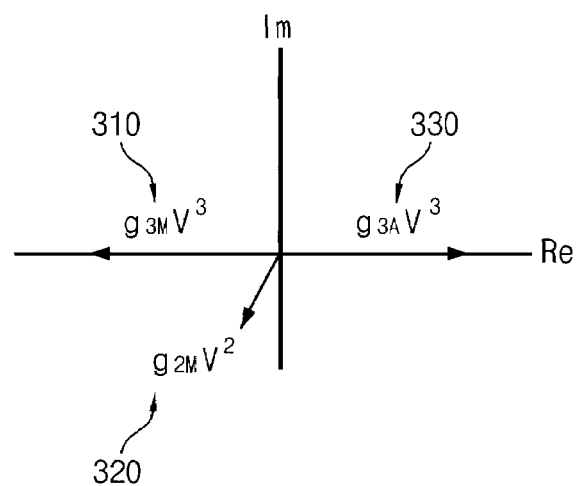
FIG. 3B is a vector diagram illustrating intermodulation components included in an output signal of the amplifier of FIG. 3A.

Embodiments of the present invention will now be described more fully with reference to the accompanying drawings, in which exemplary embodiments are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

It will be understood that, although the terms first, second, etc., may be used herein to describe various elements, these elements should not be limited by these terms. These terms are used to distinguish one element from another. For example, a first element could be termed a second element, and similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
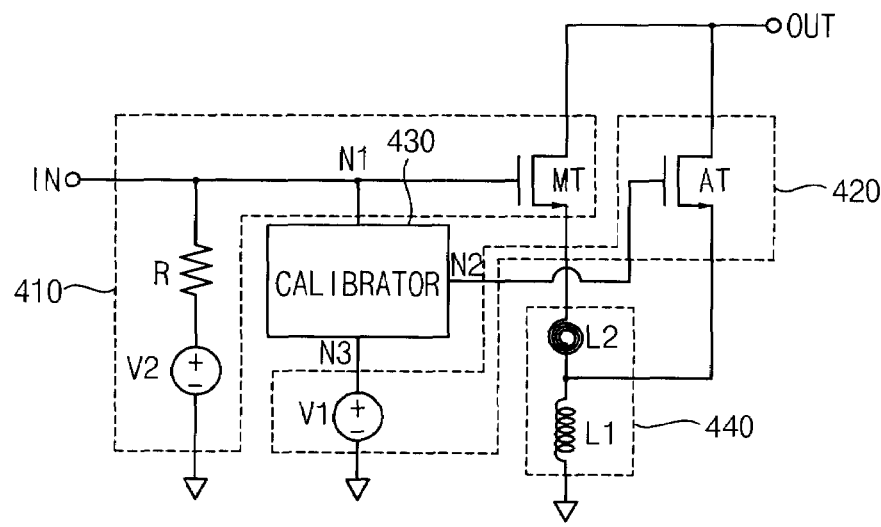
FIG. 4 is a circuit diagram illustrating a low noise amplifier, according to an exemplary embodiment of the present invention.

FIG. 4 is a circuit diagram illustrating a low noise amplifier, according to an illustrative embodiment of the present invention.

Referring to FIG. 4, the low noise amplifier includes a main amplifier unit 410, an auxiliary amplifier unit 420, an adjusting unit 430 and an impedance matching unit 440.

The main amplifier unit 410 amplifies a first input signal provided through an input node IN to output a first output signal through an output node OUT. In the depicted embodiment, the main amplifier unit 410 includes a first NMOS transistor MT operating in a strong inversion region. The main amplifier unit 410 may include a bias voltage source V2 and a resistor R for operating the first NMOS transistor MT in the strong inversion region.

A gate terminal of the first NMOS transistor MT receives the first input signal. A drain terminal of the first NMOS transistor MT outputs the first output signal. A source terminal of the NMOS transistor MT is coupled to the impedance matching unit 440.

The auxiliary amplifier unit 420 amplifies a second input signal provided from the adjusting unit 430 (e.g., calibrator) to output a second output signal through the output node OUT. In an example embodiment, the auxiliary amplifier unit 420 includes a second NMOS transistor AT operating in a weak inversion region. The auxiliary amplifier unit 420 may include a bias voltage source V1 for operating the second NMOS transistor AT in the weak inversion region.

A gate terminal of the second NMOS transistor AT receives the second input signal. A drain terminal of the second NMOS transistor AT outputs the second output signal. A source terminal of the NMOS transistor is coupled to the impedance matching unit 440.

The drain terminal of the first NMOS transistor MT and the drain terminal of the second NMOS transistor AT are commonly coupled to the output node OUT to superpose the first output signal and the second output signal. Thus, for example, the third order intermodulation distortion component included in the first output signal may be superposed on the third order intermodulation distortion component included in the second output signal. A third order intermodulation distortion component included in the superposed output signal may be reduced by biasing the second NMOS transistor AT to induce opposite characteristics of the intermodulation components in the first and second output signals.

The third order intermodulation distortion component may include a second order harmonic component and a third order harmonic component. When the transistor MT of the two transistors MT and AT coupled in parallel is biased in the strong inversion region and the transistor AT is biased in the weak inversion region, the third order harmonic components included in signals output through the commonly coupled drain terminals of the two transistors MT and AT have different phases. Thus, the third order harmonic components of the output signals of the two transistors may be canceled to reduce the third order intermodulation distortion.

Additionally, the second order harmonic component causing the third order intermodulation distortion may be reduced by the adjusting unit 430. The adjusting unit 430 adjusts the third order intermodulation distortion of the second output signal of the auxiliary amplifier unit 420. The adjusting unit 430 is coupled to the input node IN, the second NMOS transistor AT and the bias voltage V1. The adjusting unit 430 includes a capacitor unit (not shown) and/or a resistor unit (not shown) to generate the second input signal provided to the auxiliary amplifier 420 based on the first input signal and a time constant determined by a capacitance of the capacitor unit and/or a resistance of the resistor unit in the adjusting unit 430. The adjusting unit 430 adjusts the time constant, for example, by adjusting the capacitance of the capacitor unit and/or the resistance of the resistor unit.

The capacitor unit of the adjusting unit 430 may include a capacitor for blocking a direct current, and the resistor unit of the adjusting unit 430 may include a resistor for radio frequency (RF) choke, for example. In an exemplary embodiment, the adjusting unit 430 may be used as a bias block for operating the second NMOS transistor in the weak inversion region. The adjusting unit 430 adjusts the time constant in response to a control signal to adjust the third order intermodulation distortion included in the output signal. A third order input intercept point may be changed according to variations of a manufacturing process. The low noise amplifier according to embodiments of the present invention may thus adjust the third order input intercept point using the control signal, even after an integrated chip (IC) has been manufactured, whereas the intermodulation distortion components in the conventional art, as described in FIGS. 1 through 3B, are difficult to adjust after the IC has been manufactured.

The impedance matching unit 440 may include a first inductor L1 coupled between the source terminal of the second NMOS transistor AT and the power supply voltage, and a second inductor L2 coupled between the source terminal of the first NMOS transistor MT and the source terminal of the second NMOS transistor AT. The first inductor L1 may be a down bond wire and the second inductor L2 may be a spiral inductor, for example. Inductances of the first inductor L1 and the second inductor L2 may be varied to adjust the third order intermodulation distortion of the output signal.

FIGS. 5A through 5D are circuit diagrams illustrating examples of the adjusting unit included in the low noise amplifier of FIG. 4.

Figure 5A:
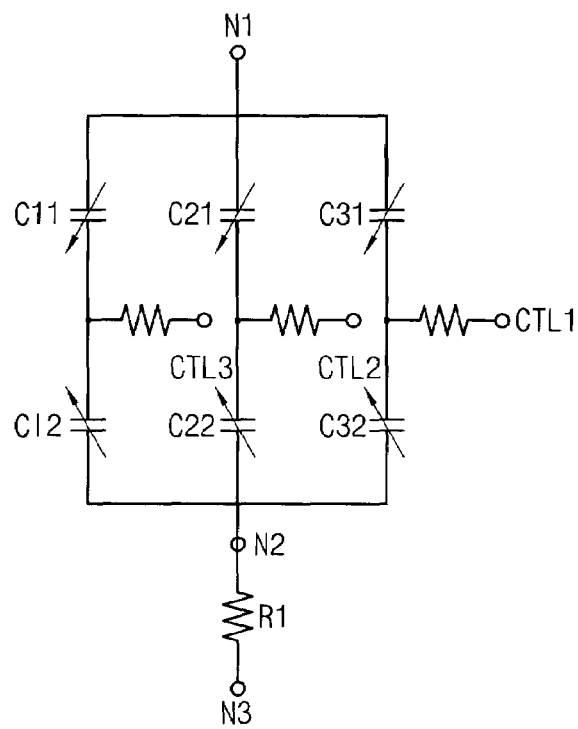
FIGS. 5A through 5D are circuit diagrams illustrating examples of an adjusting unit included in the low noise amplifier of FIG. 4, according to exemplary embodiments of the present invention.

FIG. 5A is a circuit diagram illustrating an exemplary adjusting unit 430, including a capacitor bank and a resistor.

Referring to FIG. 5A, varactors C11, C21, C31, C12, C22 and C32 are coupled between a first node N1, which receives the first input signal, and a second node N2, which outputs the second input signal. The control signal may be a digital signal having multiple bits, represented by bits CTL1, CTL2 and CTL3. Each bit CTL1, CTL2 and CTL3 of the digital control signal may be provided to a cathode of each of the varactors C11, C21, C31, C12, C22 and C32. A resistor R1 is coupled between the second node N2 and a third node N3, which receives a bias voltage of the second NMOS transistor.

Capacitances of the varactors C11, C21, C31, C12, C22 and C32 may be controlled in response to each bit CTL1, CTL2 and CTL3 of the digital control signal. A capacitance between the first node N1 and the second node N2 is determined by a sum of the capacitances of the varactors C11, C21, C31, C12, C22 and C32, coupled in parallel to be adjusted in response to the digital control signal. Thus, a magnitude and a phase of the third order intermodulation distortion components may be reduced by adjusting the time constant using the control signal.

Figure 5B:
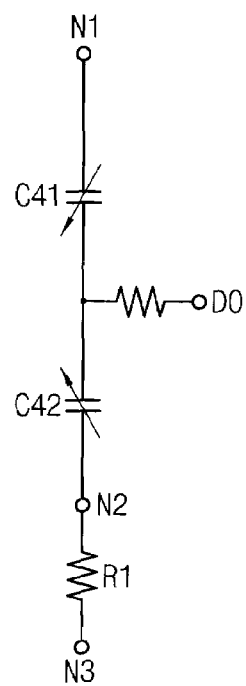

FIG. 5B is a circuit diagram illustrating an exemplary adjusting unit 430 for adjusting the capacitance of a capacitor unit using an output signal of a digital-to-analog converter.

Referring to FIG. 5B, a varactor pair C41 and C42 is coupled between the first node N1 and the second node N2. The resistor R1 is coupled between the second node N2 and the third node N3. An analog control signal DO, converted by the digital-to-analog converter (not shown), may be provided to cathodes of the varactors C41 and C42. In the depicted exemplary embodiment, the adjusting unit 430 may include the digital-to-analog converter for converting a digital signal to an analog signal. The adjusting unit 430 may provide the analog control signal to the cathodes of the varactors C41 and C42, thereby adjusting the capacitance of the capacitor unit, the time constant and the magnitude and the phase of the third order intermodulation distortion components.

Figure 5C:
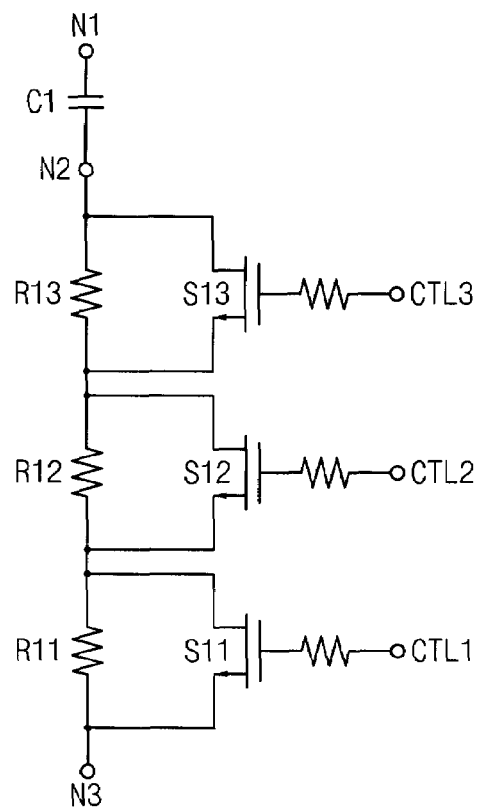

FIG. 5C is a circuit diagram illustrating an exemplary adjusting unit 430, including a capacitor and resistors according to an exemplary embodiment of the present invention.

Referring to FIG. 5C, a capacitor C1 is coupled between the first node N1 and the second node N2. Resistors R11, R12 and R13 are serially coupled between the second node N2 and the third node N3. Drain terminals of MOS switches S11, S12 and S13 are respectively coupled to first ends of the resistors R11, R12 and R13. Source terminals of MOS switches S11, S12 and S13 are respectively coupled to second ends of the resistors R11, R12 and R13. Each representative bit CTL1, CTL2 and CTL3 of the digital control signal is provided to a gate terminal of each of the MOS switches S11, S12 and S13 to turn on/off the MOS switches S11, S12 and S13, respectively. For example, when bit CTL1 of the digital control signal corresponds to logic high, the MOS transistor S11 is turned on. Accordingly, the resistor R11 coupled between a source terminal of the MOS transistor S11 and a drain terminal of the MOS transistor S11 is shorted, and the total resistance of the resistor unit is determined by the other resistors R12 and R13.

Figure 5D:
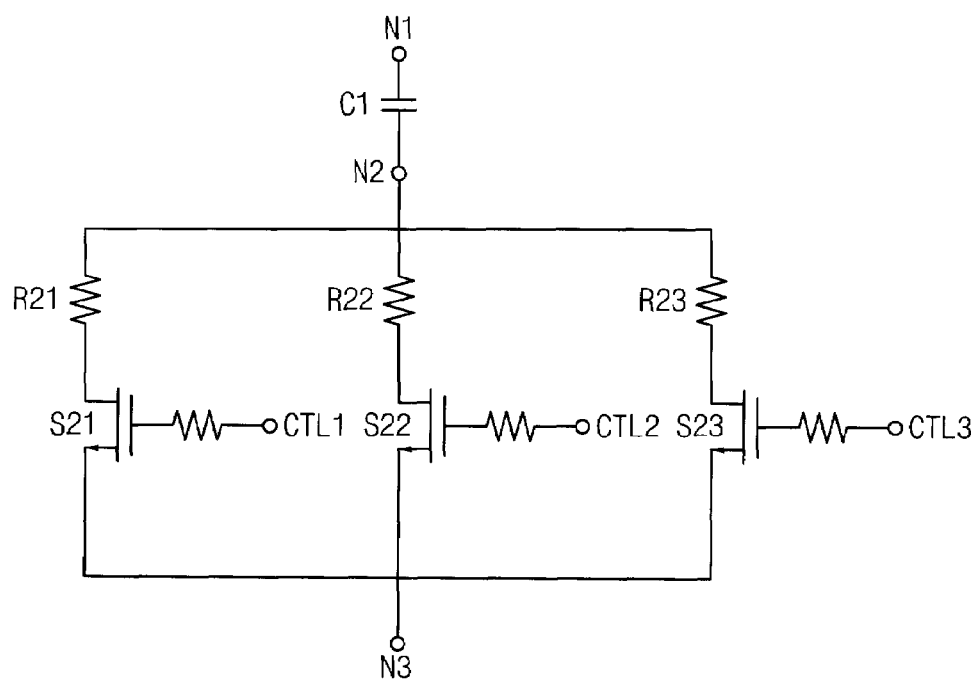

FIG. 5D is a circuit diagram illustrating an exemplary adjusting unit 430, including resistors coupled in parallel.

Referring to FIG. 5D, a capacitor C1 is coupled between the first node N1 and the second node N2. Resistors R21, R22 and R23 and MOS switches S21, S22 and S23 are coupled in parallel between the second node N2 and the third node N3. Each bit CTL1, CTL2 and CTL3 of the digital control signal is provided to a gate terminal of each of the MOS switches S21, S22 and S23 to turn on/off the MOS switches S21, S22 and S23. For example, when bit CTL1 of the digital control circuit corresponds to logic low, the MOS switch S21 may be turned off to electrically separate the resistor R21 coupled between the second node N2 and the MOS switch S21. Thus, the total resistance of the resistor unit may be determined by the other resistors R22 and R23.

In the exemplary embodiments described with reference to FIGS. 5A through 5D, the digital control signal having three bits is used, for purposes of illustration. However, it is understood that the number of bits of digital control signal may be increased or decreased according to an example embodiment.

Figure 6:
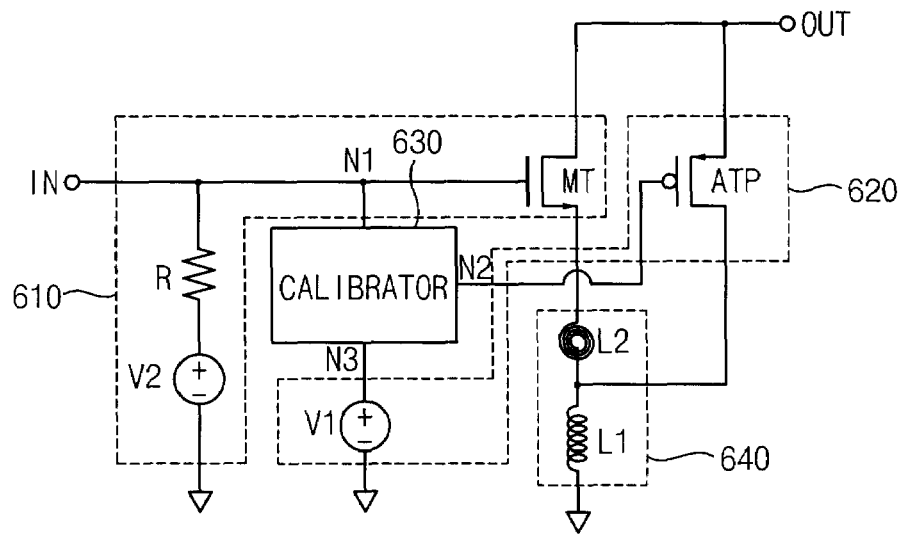
FIG. 6 is a circuit diagram illustrating a low noise amplifier, according to another exemplary embodiment of the present invention.

FIG. 6 is a circuit diagram illustrating a low noise amplifier, according to another illustrative embodiment of the present invention.

The low noise amplifier in FIG. 6 includes a main amplifier unit 610, an auxiliary amplifier unit 620, an adjusting unit 630 and an impedance matching unit 640. The low noise amplifier thus has a configuration similar to the low noise amplifier in FIG. 4, except the auxiliary amplifier unit 620 includes a PMOS transistor ATP, rather than a second NMOS transistor.

Referring to FIG. 6, a first NMOS transistor MT operates in the strong inversion region, and a PMOS transistor ATP operates in the weak inversion region. As the input signal increases, a drain current of the first NMOS transistor MT increases and a drain current of the PMOS transistor ATP decreases. Third order harmonic components causing third order intermodulation distortion in the low noise amplifier in FIG. 6 have opposite phases. Therefore, the third intermodulation distortion may be reduced by optimizing the bias voltages.

Figure 7A:
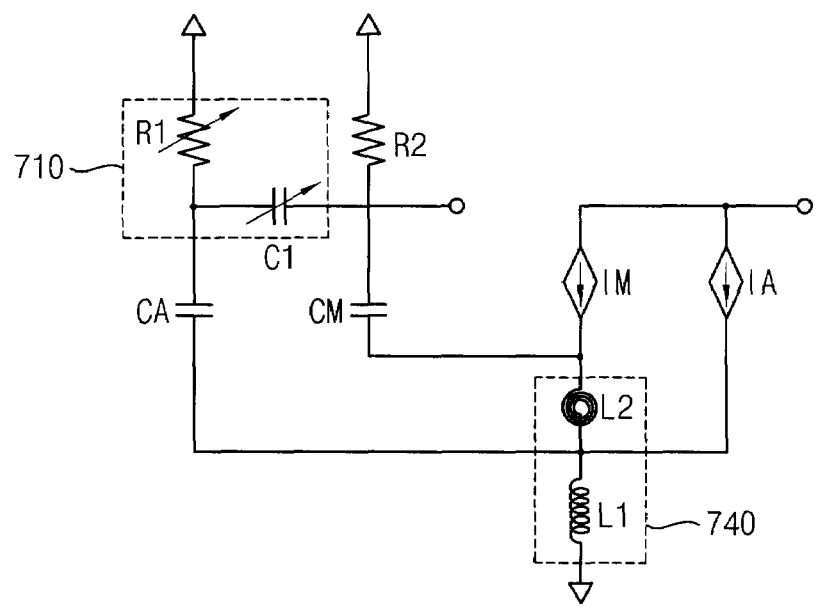
FIG. 7A is a circuit diagram illustrating an equivalent circuit of a low noise amplifier, according an exemplary embodiment of the present invention.

FIG. 7A is a circuit diagram illustrating an equivalent circuit of a low noise amplifier, according an illustrative embodiment of the present invention.

Referring to FIG. 7A, first and second NMOS transistors are respectively represented with voltage-controlled current sources IM and IA and capacitors CM and CA between the gate terminals and source terminals. The low noise amplifier includes the capacitor unit C1 and the resistor unit R1 (e.g., in an adjusting unit 710). The impedance matching unit 740 includes the first inductor L1, coupled between the second current source IA and ground voltage, and the second inductor L2, coupled between the first current source IM and the second current source IA.

Figure 7B:
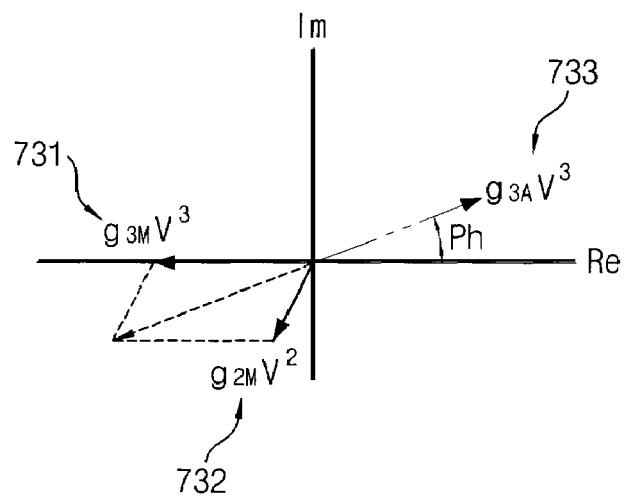
FIG. 7B is a vector diagram illustrating intermodulation distortion components included in an output signal of the low noise amplifier of FIG. 7A, according to an exemplary embodiment of the present invention.

FIG. 7B is a vector diagram illustrating intermodulation distortion components included in the output signal of the low noise amplifier of FIG. 7A.

Referring to FIG. 7B, a third order harmonic component 731 and a second order harmonic component 732 included in the first output signal, and a third order harmonic component 733 included in the second output signal, may cause third order intermodulation distortion. Examples of magnitudes and phases of such harmonic components are illustrated in FIG. 7B.

In an exemplary embodiment, the magnitude and the phase of the third order harmonic components may be adjusted by adjusting the time constant of the adjusting unit. In the vector diagram in FIG. 7B, as compared to the vector diagram in FIG. 3B, a sum of the third order harmonic component 731 included in the first output signal, the second order harmonic component 732 included in the first output signal, and the third order harmonic component 733 included in the second output signal may be adjusted to be substantially zero, thus reducing the intermodulation.

Figure 8:
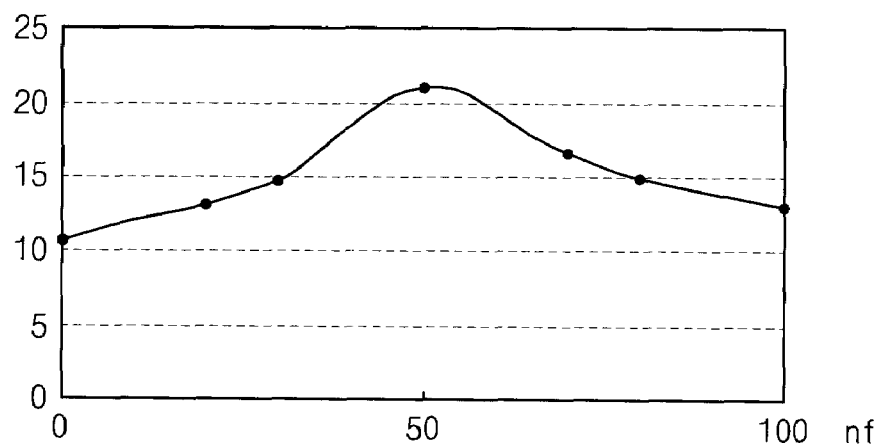
FIG. 8 is a diagram illustrating a simulation result of the low noise amplifier, according to an exemplary embodiment of the present invention.

FIG. 8 is a diagram illustrating a representative simulation result of an output signal in the low noise amplifier, according to an exemplary embodiment of the present invention.

Third order input intercept points (IIP3) of the low noise amplifier, using a three bit digital control signal, as shown in FIG. 5A, are illustrated in FIG. 8. The simulation results are listed below in Table 1.

TABLE 1

| | nf (varactor) | | | | | | |
|---|---|---|---|---|---|---|---|
| | 0 | 20 | 30 | 50 | 70 | 80 | 100 |
| control code | 000 | 001 | 010 | 011 | 101 | 110 | 111 |
| NF | 0.75 | 0.75 | 0.75 | 0.75 | 0.75 | 0.75 | 0.75 |
| IIP3 | 10.75 | 13.22 | 14.8 | 21 | 16.69 | 15 | 13 |
| GAIN | 16.06 | 16.09 | 16.1 | 16.11 | 16.12 | 16.13 | 16.14 |

In Table 1, nf represents the number of fingers of the varactors, NF represents the noise figure, IIP3 represents the third order input intercept point and GAIN represents a gain of the low noise amplifier.

When a bit of the control signal corresponds to logic low, a voltage of 0V is provided to a cathode of a varactor. When a bit of the control signal corresponds to logic high, a voltage of 2.5V is provided to the cathode of the varactor. Referring to FIG. 8 and Table 1, when the number of fingers of the varactors receiving gate voltages of 2.5V corresponds to 50, a third order input intercept point corresponds to a maximum value. The low noise amplifier may have high linearity in a range of variation of capacitance applicable to a capacitor bank, even though an impedance of the impedance unit may vary during a manufacturing process.

As discussed above, the low noise amplifier, according to exemplary embodiments of the present invention, reduces third order intermodulation distortion in an output signal by adjusting the time constant of the adjusting unit.

Further, the low noise amplifier, according to exemplary embodiments of the present invention, reduces the third order intermodulation distortion, e.g., caused by variations in manufacturing process, using a control signal even after an integrated chip has been manufactured.

Additionally, the low noise amplifier and the method of amplifying a signal, according to exemplary embodiments of the present invention, reduces the third order intermodulation distortion included in the output signal using an impedance matching unit.

While the present invention has been described with reference to exemplary embodiments, it will be apparent to those skilled in the art that various changes, substitutions and modifications may be made without departing from the spirit and scope of the present invention. Therefore, it should be understood that the above embodiments are not limiting, but illustrative.

What is claimed is:

1. A low noise amplifier comprising:
a main amplifier configured to amplify a first input signal to generate a first output signal;
an auxiliary amplifier configured to amplify a second input signal to generate a second output signal, the auxiliary amplifier being coupled to the main amplifier for superposing the second output signal and the first output signal;
an adjusting unit configured to adjust a time constant for reducing a third order intermodulation distortion of the superposed signal in response to a control signal, the adjusting unit being configured to generate the second input signal based on the time constant and the first input signal; and
an impedance matching unit coupled to the main amplifier and the auxiliary amplifier, the impedance matching unit being configured to adjust an impedance for reducing the third order intermodulation distortion of the superposed signal.

2. The low noise amplifier of claim 1, wherein the adjusting unit comprises a capacitor unit and a resistor unit, the adjusting unit being configured to adjust the time constant by adjusting at least one of a capacitance of the capacitor unit or a resistance of the resistor unit.

3. The low noise amplifier of claim 2, wherein the control signal comprises a digital signal having a plurality of bits.

4. The low noise amplifier of claim 3, wherein the capacitor unit comprises a plurality of varactors, coupled in parallel, corresponding to the plurality of bits, and
wherein the adjusting unit adjusts the capacitance of the capacitor unit by adjusting a capacitance of each varactor in response to the corresponding bit of the digital signal.

5. The low noise amplifier of claim 2, wherein the control signal comprises an analog signal, and the capacitor unit comprises a varactor, and
wherein the adjusting unit adjusts the time constant by adjusting a capacitance of the varactor in response to the analog signal.

6. The low noise amplifier of claim 3, wherein the resistor unit comprises a plurality of serially connected pairs of resistors and MOS transistors corresponding to the plurality of bits, each resistor being coupled between a drain terminal and a source terminal of each corresponding MOS transistor, and
wherein the adjusting unit adjusts the resistance of the resistor unit by adjusting a resistance of each pair in response to the corresponding bit of the digital signal provided to a gate terminal of the respective MOS transistor.

7. The low noise amplifier of claim 3, wherein the resistor unit comprises a plurality of resistors coupled in parallel and a plurality of MOS switches coupled to the plurality of resistors, a gate terminal of each of the plurality of MOS switches corresponding to a bit of the plurality of bits in the digital control signal, and
wherein the adjusting unit adjusts the resistance of the resistor unit in response to the plurality of bits provided to the corresponding gate terminals of the plurality of MOS switches.

8. The low noise amplifier of claim 2, wherein the capacitor unit is coupled between a first node for receiving the first input signal and a second node for outputting the second input signal, and the resistor unit is coupled between the second node and a third node for receiving a bias voltage of the auxiliary amplifier.

9. The low noise amplifier of claim 1, wherein the impedance matching unit comprises:
a first inductor coupled between the auxiliary amplifier and a ground voltage; and
a second inductor coupled between the main amplifier and the auxiliary amplifier.

10. The low noise amplifier of claim 9, wherein the first inductor comprises a down bond wire, and the second inductor comprises a spiral inductor.

11. The low noise amplifier of claim 1, wherein the main amplifier comprises a first NMOS transistor having a gate terminal for receiving the first input signal, a drain terminal for outputting the first output signal and a source terminal coupled to the impedance matching unit.

12. The low noise amplifier of claim 11, wherein the auxiliary amplifier comprises a second NMOS transistor having a gate terminal for receiving the second input signal, a drain terminal for outputting the second output signal and a source terminal coupled to the impedance matching unit.

13. The low noise amplifier of claim 11, wherein the auxiliary amplifier comprises a PMOS transistor having a gate terminal for receiving the second input signal, a source terminal for outputting the second output signal and a drain terminal coupled to the impedance matching unit.

14. The low noise amplifier of claim 1, wherein the main amplifier comprises a first MOS transistor operating in a strong inversion region.

15. The low noise amplifier of claim 1, wherein the auxiliary amplifier comprises a second MOS transistor operating in a weak inversion region.

16. A low noise amplifier comprising:
a first amplifier configured to provide a first output signal by amplifying a first input signal;
an second amplifier configured to provide a second output signal by amplifying a second input signal, the first and second output signals being superposed;
an adjusting unit configured to provide the second input signal based on the first input signal and a time constant, the adjusting unit comprising at least one of a capacitor and a resistor; and
an impedance matching unit coupled to the first amplifier and the second amplifier, the impedance matching unit being configured to adjust an impedance for reducing a third order intermodulation distortion of the superposed signal,
wherein the adjusting unit adjusts the time constant by adjusting at least one of a capacitance of the capacitor or a resistance of the resistor in response to a control signal to reduce the third order intermodulation distortion of the superposed signal.

17. The low noise amplifier of claim 16, wherein the first amplifier comprises a first NMOS transistor having a gate terminal for receiving the first input signal, a drain terminal for outputting the first output signal and a source terminal coupled to the impedance matching unit.

18. The low noise amplifier of claim 17, wherein the second amplifier comprises a second NMOS transistor having a gate terminal for receiving the second input signal, a drain terminal for outputting the second output signal and a source terminal coupled to the impedance matching unit.

19. The low noise amplifier of claim 17, wherein the second amplifier comprises a PMOS transistor having a gate terminal for receiving the second input signal, a source terminal for outputting the second output signal and a drain terminal coupled to the impedance matching unit.

20. A low noise amplifier comprising:
a first amplifier configured to provide a first output signal by amplifying a first input signal, the first amplifier comprising an NMOS transistor having a gate terminal for receiving the first input signal, a drain terminal for outputting the first output signal and a source terminal coupled to an impedance matching unit;
a second amplifier configured to provide a second output signal by amplifying a second input signal, the first and second output signals being superposed; and
an adjusting unit configured to provide the second input signal based on the first input signal and a time constant, the adjusting unit comprising at least one of a capacitor and a resistor,
wherein the adjusting unit adjusts the time constant by adjusting at least one of a capacitance of the capacitor or a resistance of the resistor in response to a control signal to reduce a third order intermodulation distortion of the superposed signal.

* * * * *